(12) United States Patent
Kamitsuna et al.

(10) Patent No.: US 11,327,258 B2
(45) Date of Patent: May 10, 2022

(54) OPTICAL MODULE

(71) Applicant: YOKOWO CO., LTD., Tokyo (JP)

(72) Inventors: Hideki Kamitsuna, Tokyo (JP); Akira Ohki, Tokyo (JP)

(73) Assignee: YOKOWO CO., LTD., Tokyo (JP)

( * ) Notice: Subject to any disclaimer, the term of this patent is extended or adjusted under 35 U.S.C. 154(b) by 17 days.

(21) Appl. No.: 16/629,756

(22) PCT Filed: Jul. 11, 2017

(86) PCT No.: PCT/JP2017/025298
§ 371 (c)(1),
(2) Date: Jan. 9, 2020

(87) PCT Pub. No.: WO2019/012607
PCT Pub. Date: Jan. 17, 2019

(65) Prior Publication Data
US 2020/0292764 A1    Sep. 17, 2020

(51) Int. Cl.
*G02B 6/42* (2006.01)
(52) U.S. Cl.
CPC ............. *G02B 6/428* (2013.01); *G02B 6/421* (2013.01); *G02B 6/4283* (2013.01)
(58) Field of Classification Search
CPC .................................................... G02B 6/4292
See application file for complete search history.

(56) References Cited

U.S. PATENT DOCUMENTS

| 9,104,000 | B2 * | 8/2015 | Sunaga | G02B 6/428 |
| 2002/0031150 | A1 | 3/2002 | Aikiyo et al. | |
| 2004/0037334 | A1 | 2/2004 | Tomoyuki et al. | |
| 2004/0208211 | A1 | 10/2004 | Shigenobu et al. | |
| 2005/0110105 | A1 | 5/2005 | Yoshiki et al. | |
| 2007/0051877 | A1 | 3/2007 | Kazuhiro et al. | |
| 2007/0230878 | A1 * | 10/2007 | Nakazawa | G02B 6/4246 385/92 |
| 2008/0187272 | A1 * | 8/2008 | Sato | G02B 6/4292 385/93 |

(Continued)

FOREIGN PATENT DOCUMENTS

| JP | 2001-284700 A | 10/2001 |
| JP | 2003-241029 A | 8/2003 |

(Continued)

OTHER PUBLICATIONS

International Search Report & Written Opinion dated Oct. 3, 2017 corresponding to International Patent Application No. PCT/JP2017/025298, and partial English translation thereof.

(Continued)

*Primary Examiner* — Eric Wong
(74) *Attorney, Agent, or Firm* — Squire Patton Boggs (US) LLP

(57) ABSTRACT

This optical module comprises a stem; lead pins extending through the stem; glasses filled between the stem and the lead pins; elements (photodiode, amplifier) disposed on a first main surface of the stem, and connected to the lead pins; FPC in contact with a second main surface of the stem; a cap attachable to the stem; and an aligning-fixing parts (metal-made flange, Z-sleeve) that aligns an optical fiber stub with the cap and fix the optical fiber stub to the cap.

20 Claims, 13 Drawing Sheets

(56) References Cited

U.S. PATENT DOCUMENTS

| | | | |
|---|---|---|---|
| 2010/0006863 A1 | 1/2010 | Ban et al. | |
| 2011/0216998 A1* | 9/2011 | Symington | G02B 3/0075 |
| | | | 385/14 |
| 2012/0039572 A1* | 2/2012 | Amirkiai | G02B 6/4281 |
| | | | 385/88 |
| 2012/0207437 A1 | 8/2012 | Kang et al. | |
| 2013/0182390 A1* | 7/2013 | Teo | H05K 7/2039 |
| | | | 361/707 |
| 2017/0168255 A1 | 6/2017 | Komatsu et al. | |

FOREIGN PATENT DOCUMENTS

| | | |
|---|---|---|
| JP | 2005-294429 A | 10/2005 |
| JP | 2007042756 A | 2/2007 |
| JP | 2007-123739 A | 5/2007 |
| JP | 2009-253064 A | 10/2009 |
| JP | 2009-302438 A | 12/2009 |
| JP | 2011-129546 A | 6/2011 |
| JP | 2012-256692 A | 12/2012 |
| JP | 2016-018969 A | 2/2016 |
| JP | 2017-108064 A | 6/2017 |

OTHER PUBLICATIONS

Jul. 27, 2020 Extended Search Report issued in European Patent Application No. 17917577.3.

* cited by examiner

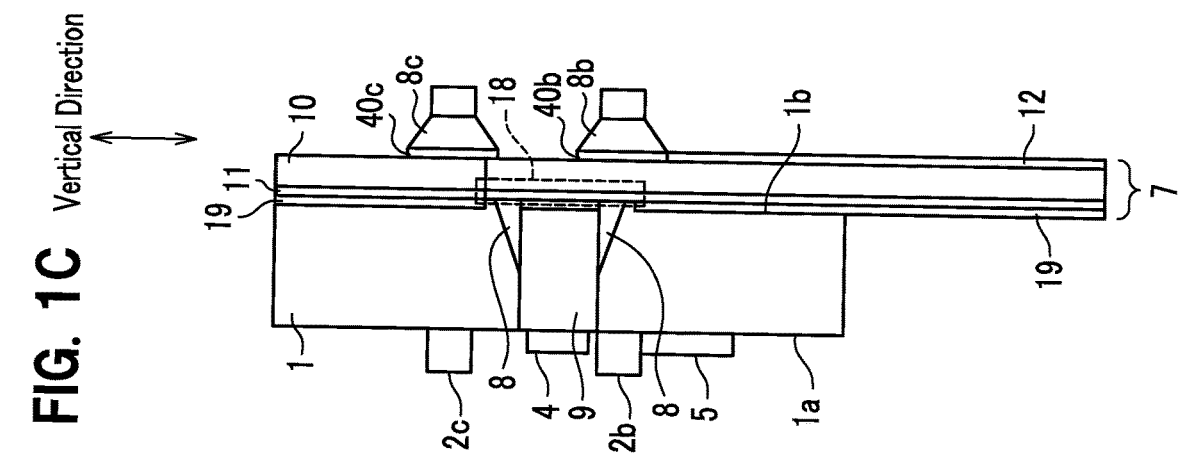
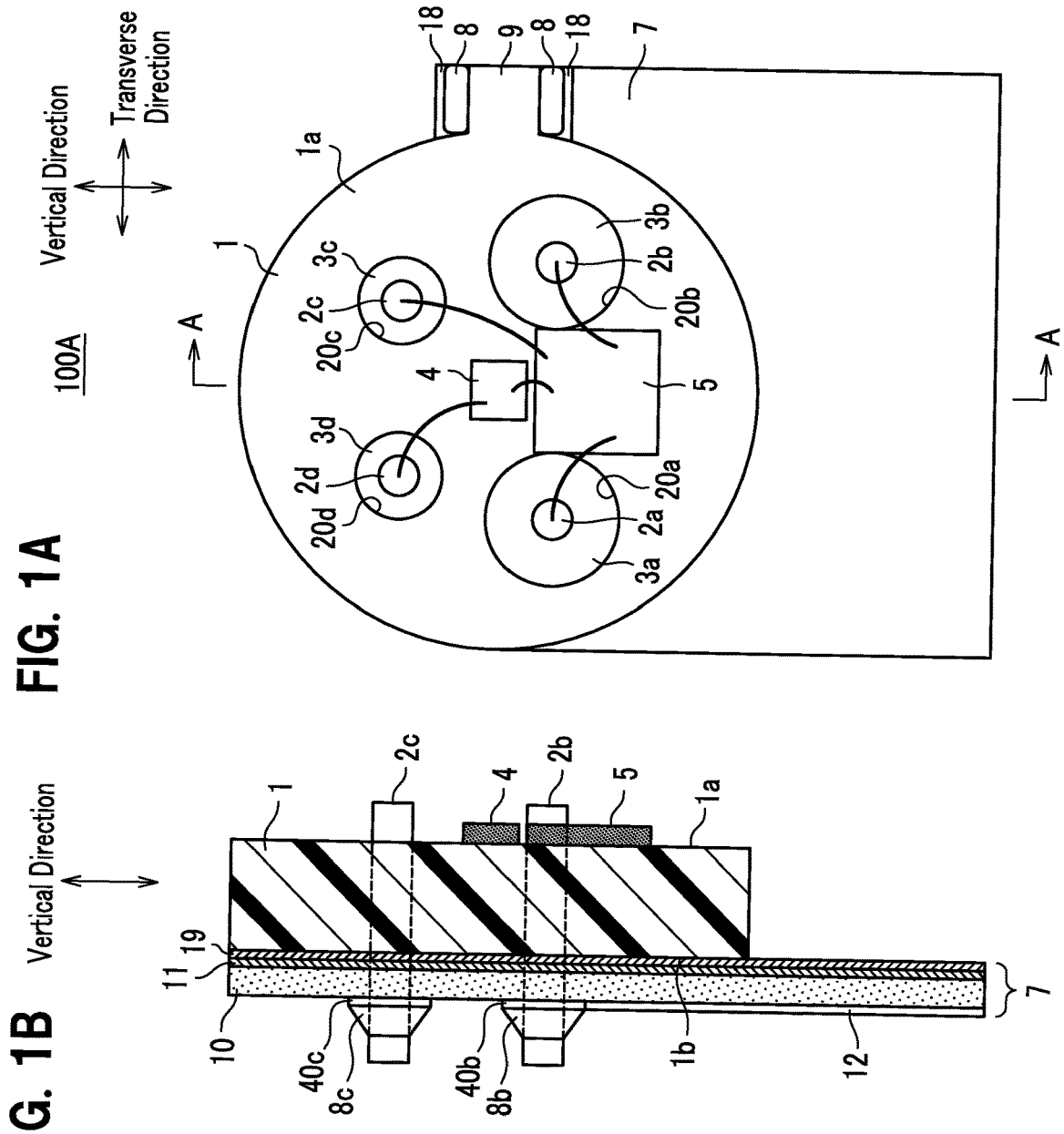

200

OPTICAL MODULE

TECHNICAL FIELD

The present invention relates to an optical module used for optical communication.

BACKGROUND ART

Along the development and increasingly wider use of the optical communication, an optical module for sending and receiving an optical signal has been demanded to satisfy needs including not only a higher transmission speed and a lower cost, but also a reduction in the size (particularly, a low height) to an extent that the optical module is small enough to be housed in a small-size/thin apparatus and a high-density packaging apparatus. For the optical module on which an optical element is mounted, alignment in a micrometer order between the optical element and an optical fiber or the like is required. A method of satisfying these needs is to mount the optical element on a TO (Transistor Outline)-CAN package and perform a precise optical axis alignment by YAG (Yttrium Aluminum Garnet) laser welding. As the lowest-cost method, this method is in wide use.

Technical contents concerning the optical module such as the TO-CAN package are disclosed in, for example, Patent Literature 1 and 2. Patent Literature 1 discloses "An optical module including a spherical lens and an electronic circuit with a photoelectric conversion element, and configured to convert an optical signal into an electrical signal and an electrical signal into an optical signal using the photoelectric conversion element, comprising: a stem supporting the electronic circuit with the photoelectric conversion element; a cylindrical cap member joined to the stem, and holding the lens such that the lens faces the photoelectric conversion element; and a sleeve (receptacle) joined to the cap member, and being capable of holding an optical fiber such that the optical fiber faces the lens, wherein the cap member has an opening for holding the lens, and an inner diameter of the opening is less than a diameter of the lens."

Meanwhile, Patent Literature 2 discloses "An optical module comprising: a stem; a signal pin extending through the stem; an insulated glass filled between the stem and the signal pin; a ground pin welded to a main surface of the stem; a weld part existing on a root of the ground pin, and being wider than the ground pin; a flexible printed circuit board including a first through-hole which the signal pin penetrates, and a second through-hole which the ground pin penetrates, and attached to the stem; a wiring pattern provided on an upper surface of the flexible printed circuit board, and connected to the signal pin; and a ground conductor provided on a lower surface of the flexible printed circuit board, and connected to the stem, wherein a portion of the flexible printed circuit board which surrounds the second through-hole is folded along the weld part, and around the signal pin, the ground conductor on the lower surface of the flexible printed circuit board is in close contact with the main surface of the stem."

CITATION LIST

Patent Literature

Patent Literature 1: Japanese Patent Application Publication No. 2003-241029

Patent Literature 2: Japanese Patent Application Publication No. 2012-256692

SUMMARY OF INVENTION

Technical Problem

As described in Patent Literature 1 and 2, multiple pins (or lead pins) need to be disposed in the main surface of the stem of the optical module. Thus, the area of the main surface of the stem needs to be suitably large. The optical module including the stem with that large area has difficulty in satisfying the above-mentioned need for the size reduction. In addition, the conventional optical module which has to include the sleeve (receptacle) capable of holding the optical fiber cannot be made smaller in size than the receptacle.

With the above situation taken into consideration, an object of the present invention is to reduce the size of the optical module.

Solution to Problem

To solve the above problems, an aspect of the present invention is an optical module characterized in that the optical module includes: a stem; a lead pin extending through the stem; an insulated material filled between the stem and the lead pin; an element disposed on a first main surface of the stem, and connected to the lead pin; a circuit board in contact with a second main surface of the stem; a cap attachable to the stem; an optical fiber stub; and an aligning-fixing part which aligns and fixes the fiber stub to the cap.

The other aspects of the present invention will be described using embodiments of the present invention.

Advantageous Effects of Invention

The present invention can reduce the size of the optical module.

BRIEF DESCRIPTION OF DRAWINGS

FIG. 1A is a front view of an optical module according to a first embodiment; FIG. 1B is a cross-sectional view of the optical module taken along the A-A line of FIG. 1A; and FIG. 1C is a side view of the optical module.

DESCRIPTION OF EMBODIMENTS

Hereinafter, embodiments of the present invention will be described with reference to the accompanying drawings. It should be noted that in the following descriptions, the meaning of a word "vertical" includes "substantially vertical" for the sake of explanatory convenience. Similarly, the meaning of a word "orthogonal" includes "substantially orthogonal," the meaning of words "on a straight line" includes "substantially on a straight line," and the meaning of a word "parallel" includes "substantially parallel."

Comparative Example

Figure 10A:
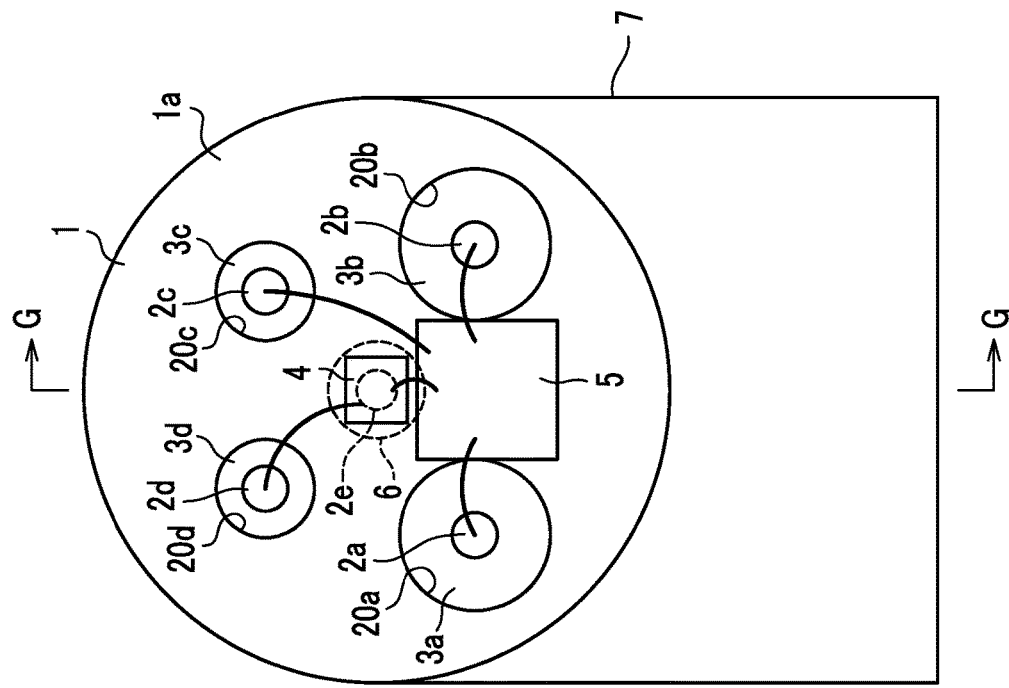
FIG. 10A is a front view of an optical module according to a comparative example.
Figure 10B:
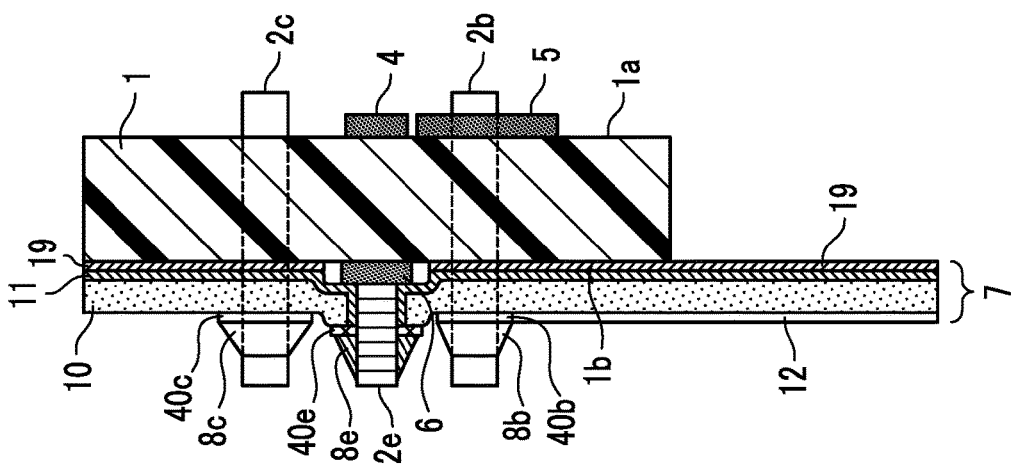
FIG. 10B is a cross-sectional view of the optical module taken along the G-G line of FIG. 10A.

To begin with, descriptions will be provided for an optical module according to a comparative example of the present invention. The optical module 200 according to the comparative example illustrated in FIGS. 10A and 10B is an optical module using a conventional TO-CAN package for optical reception. As illustrated in FIGS. 10A and 10B, the optical module 200 includes a stem 1, five lead pins 2a to 2e, glasses 3a to 3d, a photodiode 4, an amplifier 5, a weld part 6 and a flexible printed circuit board (FPC) 7.

The stem 1 is a disc-shaped body which supports elements such as the photodiode 4 and the amplifier 5. The stem 1 includes a front main surface 1a (a first main surface) and a rear main surface 1b (a second main surface). The stem 1 further includes through-holes 20a to 20d extending in a plate-thickness direction.

The first lead pin 2a is a pin (signal pin) which outputs a signal. The second lead pin 2b is a pin (signal pin) which outputs an inverted signal. The third lead pin 2c is a pin which biases the amplifier 5. The fourth lead pin 2d is a pin which biases the photodiode 4. The lead pins 2a to 2d penetrate the respective through-holes 20a to 20d in the stem 1, and are fixed therein by the respective glasses 3a to 3d.

The fifth lead pin 2e is a ground pin for grounding. The fifth lead pin 2e is directly fixed to the rear main surface 1b of the stem 1 by welding, and an electrical potential of the fifth lead pin 2e is equal to one of (a housing of) the stem 1.

The weld part 6 is a bead where the fifth lead pin 2e is joined to the rear main surface 1b of the stem 1. A diameter of the weld part 6 is slightly larger than one of the fifth lead pin 2e.

The glasses 3a to 3d are filled in the respective through-holes 20a to 20d. The glasses 3a to 3d are insulated materials filled between the stem 1 and the respective lead pins 2a to 2d, and electrically insulate (the housing of) the stem 1 from the lead pins 2a to 2d.

The photodiode 4 is an optical element which receives an optical signal and converts the optical signal into an electrical signal. The photodiode 4 is disposed on the front main surface 1a of the stem 1, and in the center of the stem 1.

The amplifier 5 is an electrical element which amplifies the electrical signal into which the optical signal is converted. The amplifier 5 is disposed on the front main surface 1a of the stem 1, and near the center of the stem 1.

An output terminal of the photodiode 4 is wire-connected to an input terminal of the amplifier 5. A bias terminal of the photodiode 4 is wire-connected to the fourth lead pin 2d. A bias terminal of the amplifier 5 is wire-connected to the third lead pin 2c. A signal output terminal of the amplifier 5 is wire-connected to the first lead pin 2a. An inverted signal output terminal of the amplifier 5 is wire-connected to the second lead pin 2b.

Because of the above-discussed configuration, the optical signal received by the photodiode 4 is outputted as a differential electrical signal between the first lead pin 2a and the second lead pin 2b. The outputted differential electrical signal is taken out to the outside of the optical module 200 via the FPC 7 attached to a TO-CAN package for optical reception.

The FPC 7 is a foldable high-speed wiring board and is in close contact with the rear main surface 1b of the stem 1. The FPC 7 includes a high-speed signal differential wire comprising a signal transmission line and a ground formed by extending along the transmission line. The FPC 7 further includes bias supply power lines respectively for the photodiode 4 and the amplifier 5. As illustrated in FIG. 10B, the FPC 7 may have a configuration according to which, for example, a dielectric 10 (for example, polyimide) with a thickness of approximately 50 μm is located between an upper layer wire 12 and a lower layer ground 11. According to the FPC 7 having such a configuration, a microstrip line as a signal transmission line can be formed as a signal transmission line, and a high-speed wiring board which is flexible and easy to handle can be obtained.

As illustrated in FIG. 10B, the FPC 7 includes a protective layer 19. The protective layer 19 protects the lower layer ground 11, except for its regions where the lead pins 2a to 2e pass, from a side of the optical module 200 on which the stem 1 is provided. The FPC 7 further includes a protective layer (not shown) having the same function as the protective layer 19 on an opposing surface of the surface on which the stem 1 is provided. This protective layer protects the upper layer wire 12, except for regions of lands (see lands 40a to 40e in FIG. 11), from the side opposite to the side where the stem 1 is provided. The FPC 7 further has a reinforcement plate (not shown) for preventing bending and warping of the portion of the protective layer 19 in contact with the stem 1 and facilitating solder mounting. The reinforcing plate may be suitably provided at any place where curving or warping is effectively prevented except for a place where the FPC 7 is to be bent, and may be provided between the protective layer 19 and the lower layer ground 11 or between the stem 1 and the prospective layer 19. Reference signs 40b, 40c, 40e in FIG. 10B respectively denote the lands of solders 8b, 8c, 8e which serve as electrical connection means to the lead pins 2b, 2c, 2e, respectively.

Figure 11:
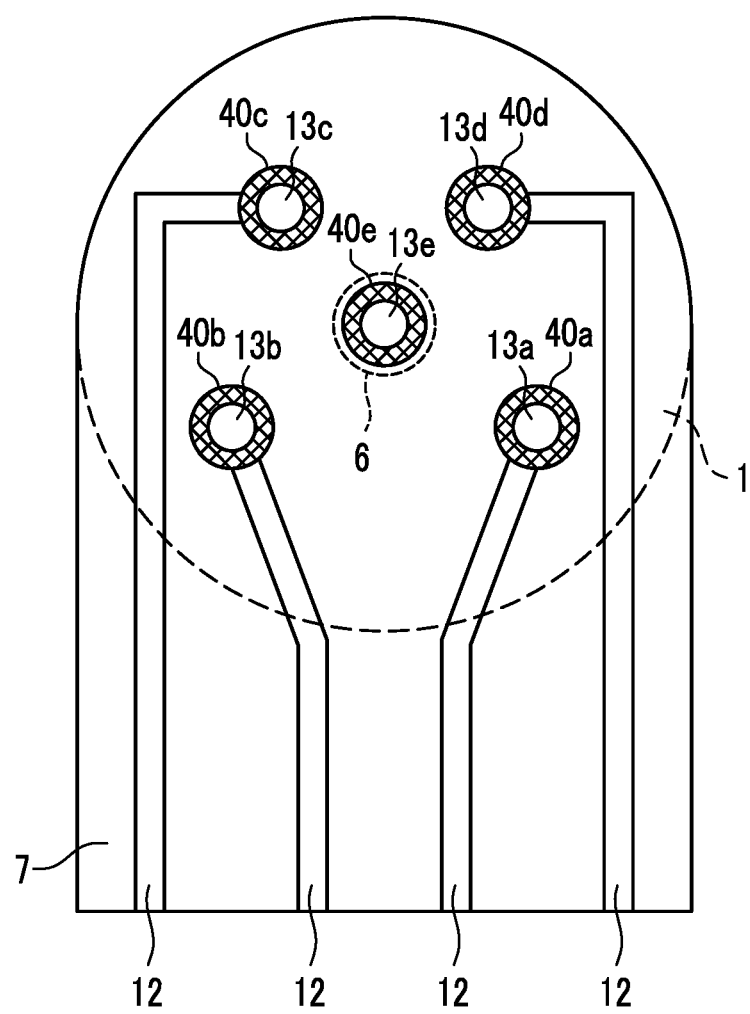
FIG. 11 is a detailed view of an FPC in the optical module according to the comparative example.

As illustrated in FIG. 11, the FPC 7 includes five through-holes 13a to 13e corresponding to the lead pins 2a to 2e. The FPC 7 further includes the lands 40a to 40e surrounding the respective through-holes 13a to 13e. Electrical connection is achieved by: inserting the lead pins 2a to 2e into the respective through-holes 13a to 13e; and soldering the lead pins 2a to 2e to the respective lands 40a to 40e.

Figure 12:
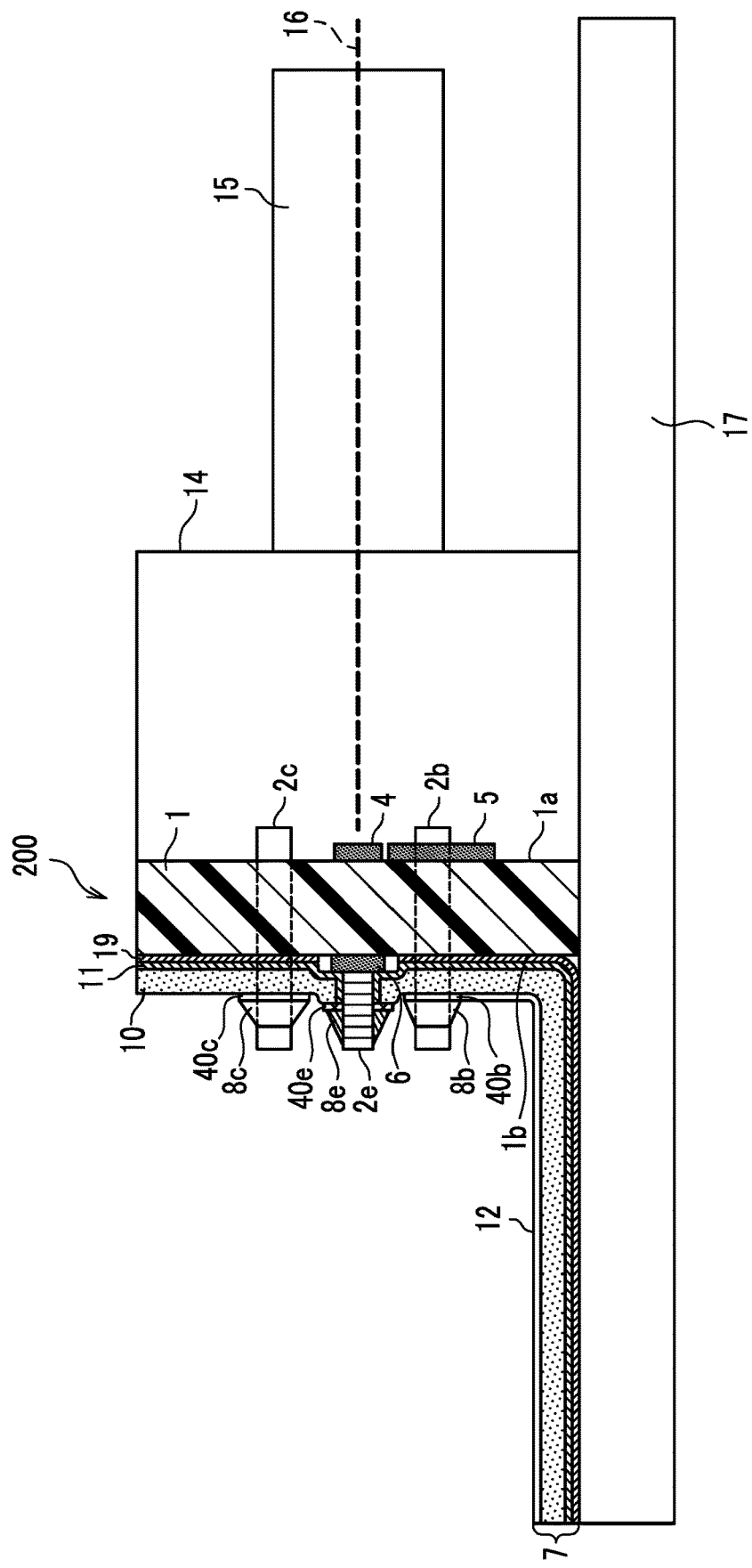
FIG. 12 is a cross-sectional view of the optical module according to the comparative example as mounted on the mother board.

As illustrated in FIG. 12, a cap 14 having a light-incident window or lens is attached to the stem 1 of the optical module 200. Thus, an optical signal from optical waveguide means 15 is received by the photodiode 4 through which an optical axis 16 of the optical waveguide means (optical connection part) 15 passes. The FPC 7 has a pad (not shown) for connecting the FPC 7 to a mother board 17. The FPC 7 can therefore send and receive an electrical signal to and from the mother board 17. Furthermore, as illustrated in FIG. 12, the optical module 200 can be attached to the mother board 17 by bending the FPC 7 at an end portion of the stem 1 such that the optical axis 16 of the optical waveguide means 15 is in parallel to the mother board 17. It is common to minimize the mounting space (low height mounting) on the motherboard 17 in this manner. The optical waveguide means (optical connection part) 15 may be formed of, for example, an optical fiber and a sleeve (receptacle) for holding the optical fiber, or may be formed by fixing one or two condenser lenses to a hollow pipe.

The area of the disc of the stem 1 in the optical module 200 according to the comparative example is generally determined by the number of needed pins and the sizes of the elements mounted thereon. The optical module 200 according to the comparative example, therefore, has difficulty in making the diameter of the stem 1 less than a predetermined size (for example, 4 mm).

In addition, when the fifth lead pin 2e serving as a ground pin is welded to the stem 1, the weld part 6 with a large width is formed around the root of the fifth lead pin 2e. This weld part 6 hinders the stem 1 and the FPC 7 from coming into close contact with each other. The FPC 7, therefore, has to be set away from the stem 1 by the thickness of the weld part 6. This results in deterioration in an reflection damping amount, and increases in inductances of the respective first and second lead pins 2a, 2b serving as the signal pins. This causes problems such as deterioration in high frequency characteristics, and hindrance to an increase in a transmission speed. Improving of high frequency characteristics by providing the stem 1 with a hole in which to place the weld part 6 is one of techniques for solving the problems, but consequently invites an increase in costs of processing the stem 1.

Furthermore, heat is dissipated from the optical module 200 mainly through the ground pin welded to the stem 1. In this respect, an excessive reduction in the size of the optical module inevitably leads to an increase in an heat generation density. The structure of the comparative example which makes the heat dissipation heavily depend on the ground pin with a small diameter of approximately 0.4 cannot realize a sufficient heat dissipation performance. This consequently invites things such as a decrease in the reliability of the optical module itself, and causes a problem of hindering the reduction in the size of the optical module.

Optical modules according to the present invention for the purpose of solving the above problems will be described by referring to multiple embodiments. In the following descriptions, the same members as described in the comparative example and embodiments will be denoted by the same reference signs. In addition, duplication in descriptions among the comparative example and embodiments (including explanation of the invention specific matters and effects brought by the invention) will be omitted whenever deemed possible, and descriptions will be provided by focusing on differences among the comparative example and embodiments.

First Embodiment

An optical module 100A illustrated in FIGS. 1A to 1C is an optical module using a TO-CAN package for optical reception according to a first embodiment. As illustrated in FIGS. 1A to 1C, the optical module 100A includes a stem 1, four lead pins 2a to 2d, glasses 3a to 3d, a photodiode 4 (an element: an optical element), an amplifier 5 (an element: an electrical element), and an FPC 7 (a circuit board: a flexible printed circuit board). The photodiode 4 and the amplifier 5 are disposed proximate to each other.

There are mainly three differences between the optical module 100A of the present embodiment and the optical module 200 of the comparative example. First, the optical module 100A does not include the lead pin 2e serving as the ground pin which the optical module 200 includes. Second, the stem 1 in the optical module 100A includes a protrusion 9. Third, the FPC 7 includes a ground connection land 18, and the protrusion 9 is soldered and thereby ground-connected to the ground connection land 18.

Like in the optical module 200 according to the comparative example, the FPC 7 is formed in the shape of a belt which extends in one direction. As illustrated in FIGS. 1A to 1C, the rear main surface 1b of the stem 1 is in contact (for example, in close contact) with a part of the surface of the FPC 7. The FPC 7 further includes a portion opposite to the protrusion 9 of the stem 1.

The ground connection land 18 is a ground-forming land. The ground connection land 18 is formed at a position opposite to the protrusion 9 in the FPC 7. The ground connection land 18 can be realized, for example, by cutting out the protective layer 19 and the reinforcement plate (not shown) at a position where the ground connection land 18 is formed and exposing the lower layer ground 11. Otherwise, the ground connection land 18 can be realized, for example, by providing a through-hole in the protective layer 19 and the reinforcement plate (not shown). A solder 8 makes a ground connection with the stem 1 at a position where the ground connection land 18 is formed.

The protrusion 9 is disposed on a side surface of the stem 1. The protrusion 9 may be formed integrally with the disc of the stem 1, for example by press working. As illustrated in FIGS. 1A to 1C, the solder 8 serving as an electrical connection means with the ground connection land 18 is attached to the protrusion 9.

The protrusion 9 of the present embodiment has a thickness similar to one of the stem 1, but is not limited to this.

Figure 2A:
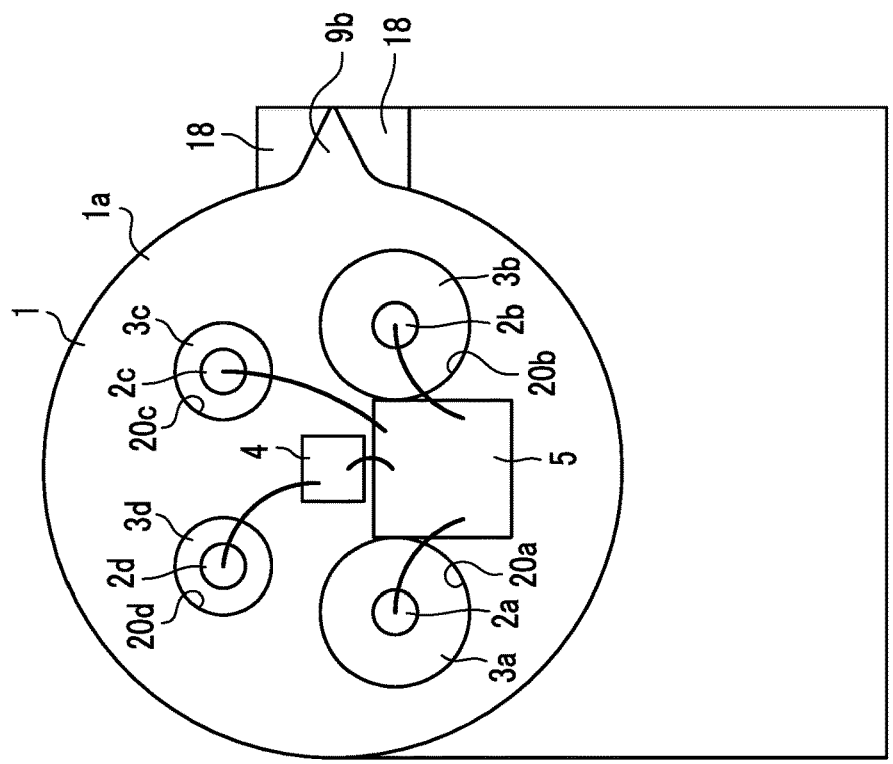
FIGS. 2A and 2B respectively illustrate examples of shapes of protrusions.
Figure 2B:
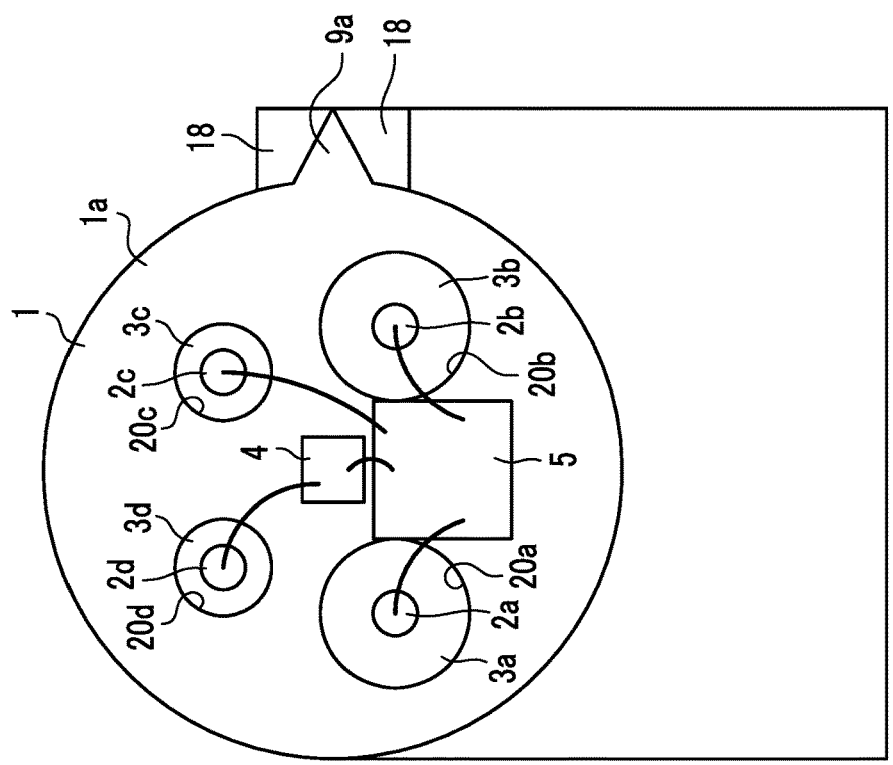

The protrusion 9 can be formed in various shapes. For example, as illustrated in FIG. 1, the protrusion 9 can be formed in a rectangular shape (in the shape of a quadrangular prism). Instead, the protrusion 9 can be formed in a triangular shape (in the shape of a triangular prism), as illustrated in FIG. 2A. Otherwise, a curved surface may be provided in each boundary between the protrusion 9 and the main body of the stem 1, as shown in FIG. 2B.

As illustrated in FIG. 1A, the ground connection land 18 is disposed on the right side of the stem 1 on the sheet of FIG. 1. The ground connection land 18 may be disposed anywhere in the circumferential direction of the stem 1, and outward of the stem 1 (for example, on the outer edge of the stem 1). A benefit of the arrangement of the ground connection land 18 outward of the stem 1, for example on the outer edge of the stem 1, is that the ground connection land 18 can be easily soldered to the stem 1. The ground connection land 18 like this makes the fifth lead pin 2e no longer necessary as the ground pin. Therefore, the region in which the ground pin is disposed on the rear main surface 1b of the stem 1 becomes unnecessary, and a diameter of the stem 1 can be designed to be small. As a result, the entire optical module 100A can be reduced in size.

In addition, in the optical module 100A of the present embodiment, the ground pin is not required, the weld part 6 (FIG. 10) exiting around the root of the ground pin also becomes unnecessary. This enables the FPC 7 to come into close contact with the rear main surface 1b of the stem 1 even in the region where the weld part 6 exists. Thus, the high-frequency characteristics can be improved through things such as reductions in inductances of the first and second lead pins 2a, 2b serving as the signal pins, and a transmission speed can be increased.

Furthermore, as illustrated in FIG. 1A, a straight line segment between the center of the stem 1 and the center of the ground connection land 18 (a straight line segment extending in the left-right direction on the sheet of FIG. 1) is orthogonal to a direction in which the FPC 7 is drawn out from the stem 1 (see arrows in FIG. 1, and the direction will be sometimes referred to as a "vertical direction"). Because of this, when the FPC 7 is mounted on the mother board 17 by being bent (see FIG. 12), the ground connection land 18 does not protrude in the up-down direction in FIG. 12 (such as from the main body of the stem 1 to the mother board 17). The vertical dimension of the optical module 100A can be reduced (low profile mounting on the mother board 17).

Incidentally, the direction orthogonal to the vertical direction as illustrated in FIG. 1 will be sometimes referred to as a "transverse direction." Like in FIG. 1, the arrows representing the vertical and transverse directions are drawn as appropriate in other drawings.

Moreover, the optical module 100A of the present embodiment can improve the heat dissipation performance of the stem 1. This is because the ground connection area between the stem 1 and the FPC 7 can be greatly increased as compared with the comparative example in which the fifth lead pin 2e having a small diameter is used as the ground pin. This makes it easy to deal with the increase in the heat dissipation density accompanied by the size reduction, and accordingly makes it possible to enhance the reliability of the smaller-sized optical module.

Second Embodiment

Figure 3A:
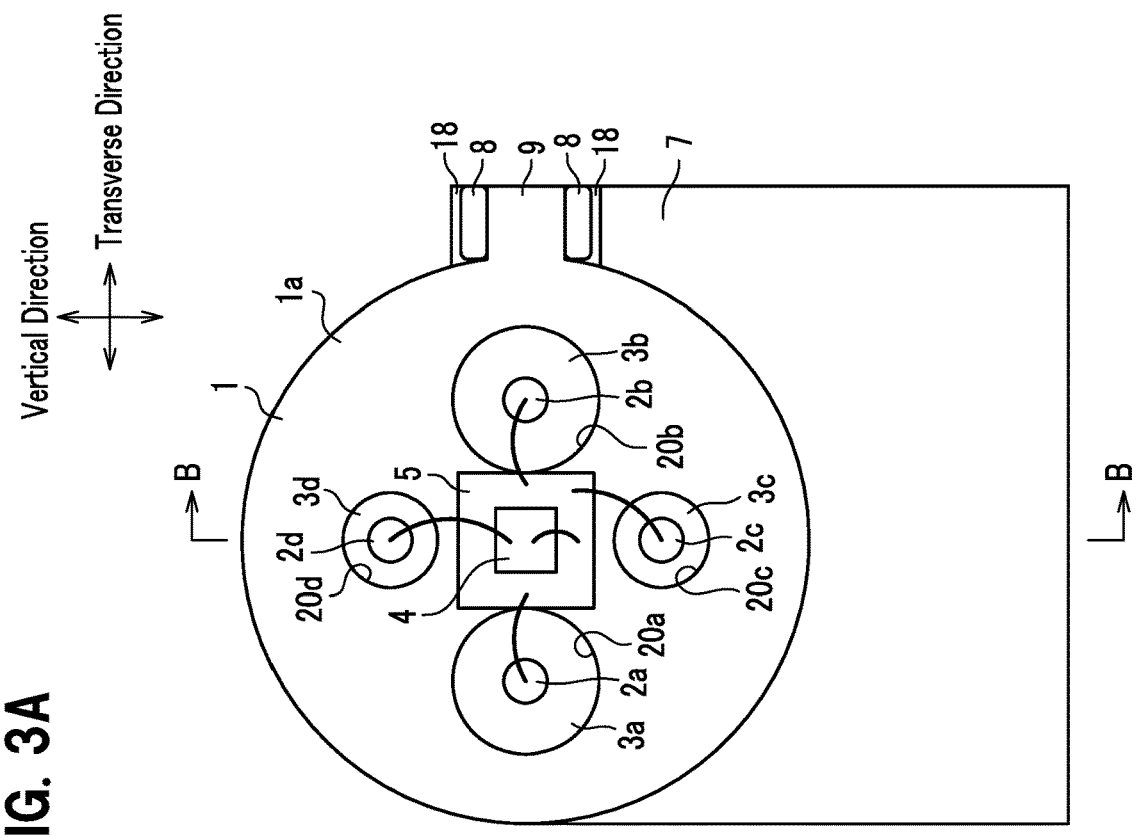
FIG. 3A is a front view of an optical module according to a second embodiment.
Figure 3B:
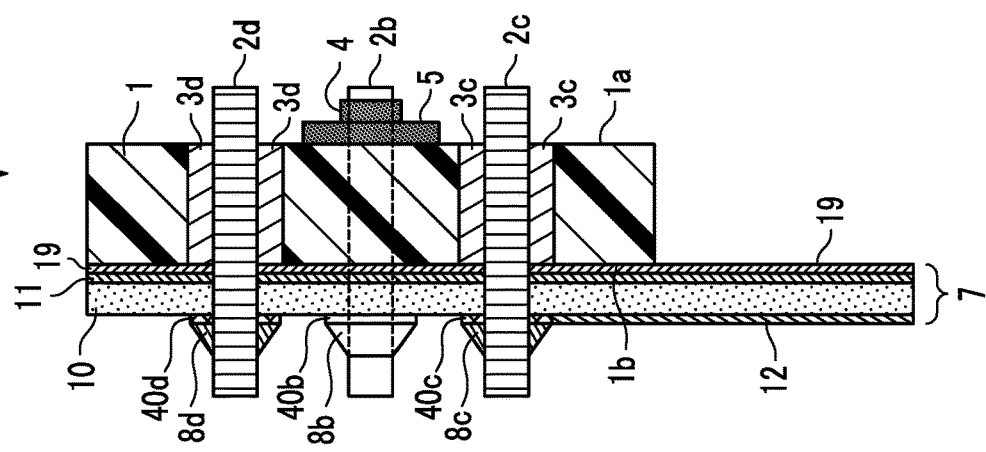
FIG. 3B is a cross-sectional view of the optical module taken along the B-B line of FIG. 3A.

An optical module 100B illustrated in FIGS. 3A and 3B is an optical module using a TO-CAN package for optical reception according to a second embodiment. There are mainly three differences between the optical module 100B of the second embodiment and the optical module 100A of the first embodiment. First, the photodiode 4 is disposed on the amplifier 5. Second, the lead pins 2a to 2d are positioned so as to surround the amplifier 5. The direction of the straight line connecting the center of the stem 1 and the center of the ground connection land 18 (or the protrusion 9) is the transverse direction.

By disposing the photodiode 4 on the amplifier 5, the region in which the photodiode 4 is disposed on the front main surface 1a of the stem 1 becomes virtually unnecessary. This makes it possible to minimize the space needed to mount the components, and to design the stem 1 with a smaller diameter. Incidentally, as illustrated in FIG. 3A, the photodiode 4 and the amplifier 5 are disposed at the center of the front main surface 1a of the stem 1.

In addition, as illustrated in FIG. 3A, the first and second lead pins 2a, 2b for the signals are disposed in the transverse direction such that a space between them is large enough for the amplifier 5 to be mounted between them. Furthermore, the third and fourth lead pins 2c, 2d for the biases are disposed in the vertical direction such that a space between them is large enough for the amplifier 5 to be mounted between them. Incidentally, the lead pins 2a to 2d may be disposed around the amplifier 5, no matter where the lead pins 2a to 2d are disposed in the circumferential direction of the stem 1. By disposing the lead pins 2a to 2d in this manner, the diameter of the stem 1 can be minimized.

Figure 4:
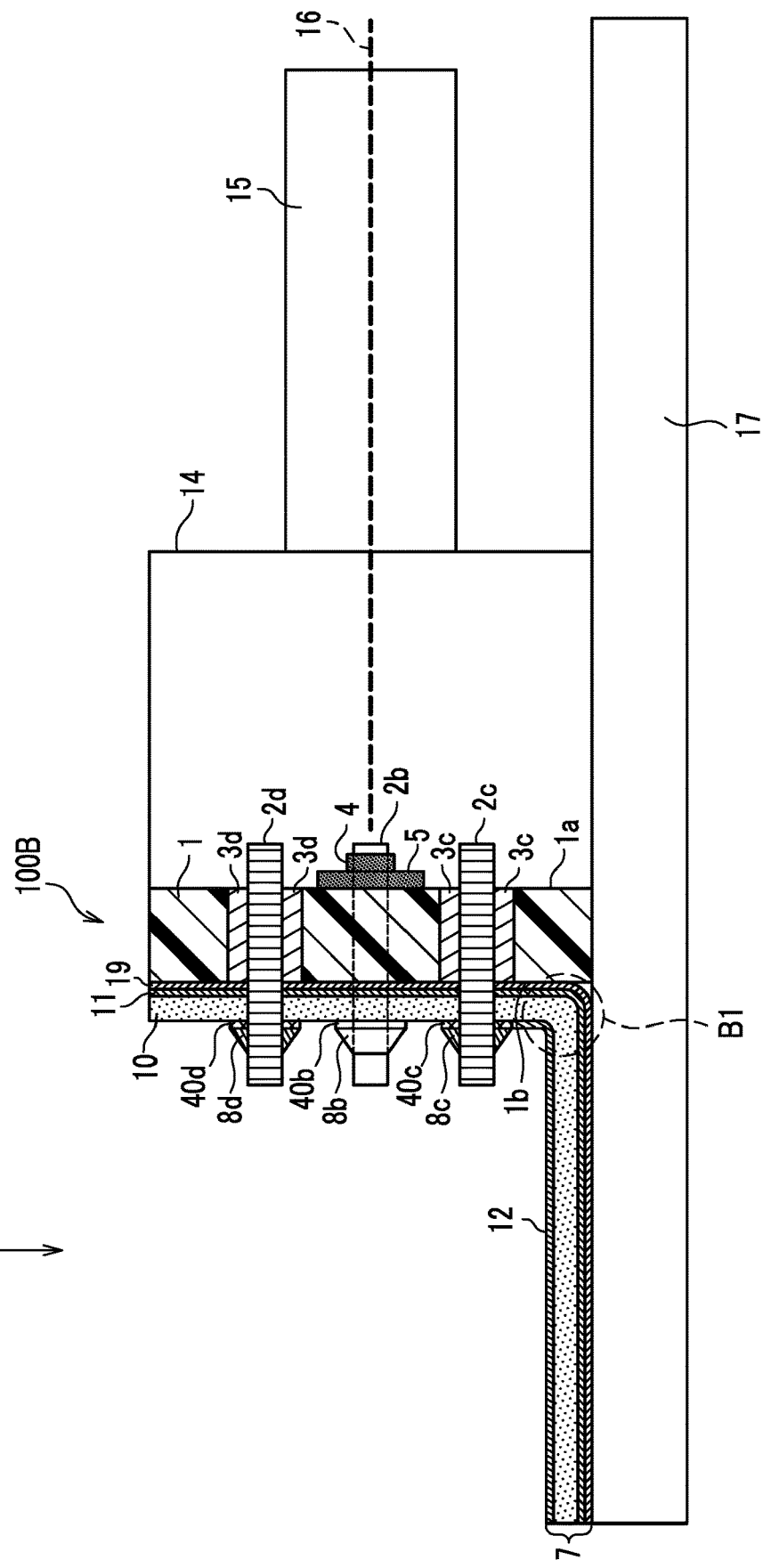
FIG. 4 is a cross-sectional view of the optical module according to the second embodiment as mounted on a mother board.

Further, the smaller the diameter of the stem 1 is, the closer the bending position when the FPC 7 is bent is to the center of the stem 1. Therefore, as shown in FIG. 4, the position near the outer side in the radial direction of the third lead pin 2c can be set as the bending position of the FPC 7 (see reference sign B1 in FIG. 4). This makes it possible to reduce the overall size of the optical module 100B, specifically to reduce the height of the optical module 100B in the vertical direction.

Moreover, since the protrusion 9 is disposed on the side surface of the stem 1, the protrusion 9 serves as a mark when the FPC 7 is assembled. Therefore, by referring to the protrusion 9, therefore, the manufacturer of the optical module 100B can easily connect the terminals of the stem 1 and the FPC 7 without mistake even when the pin arrangement is centrosymmetric as shown in FIG. 3.

Third Embodiment

Figure 5A:
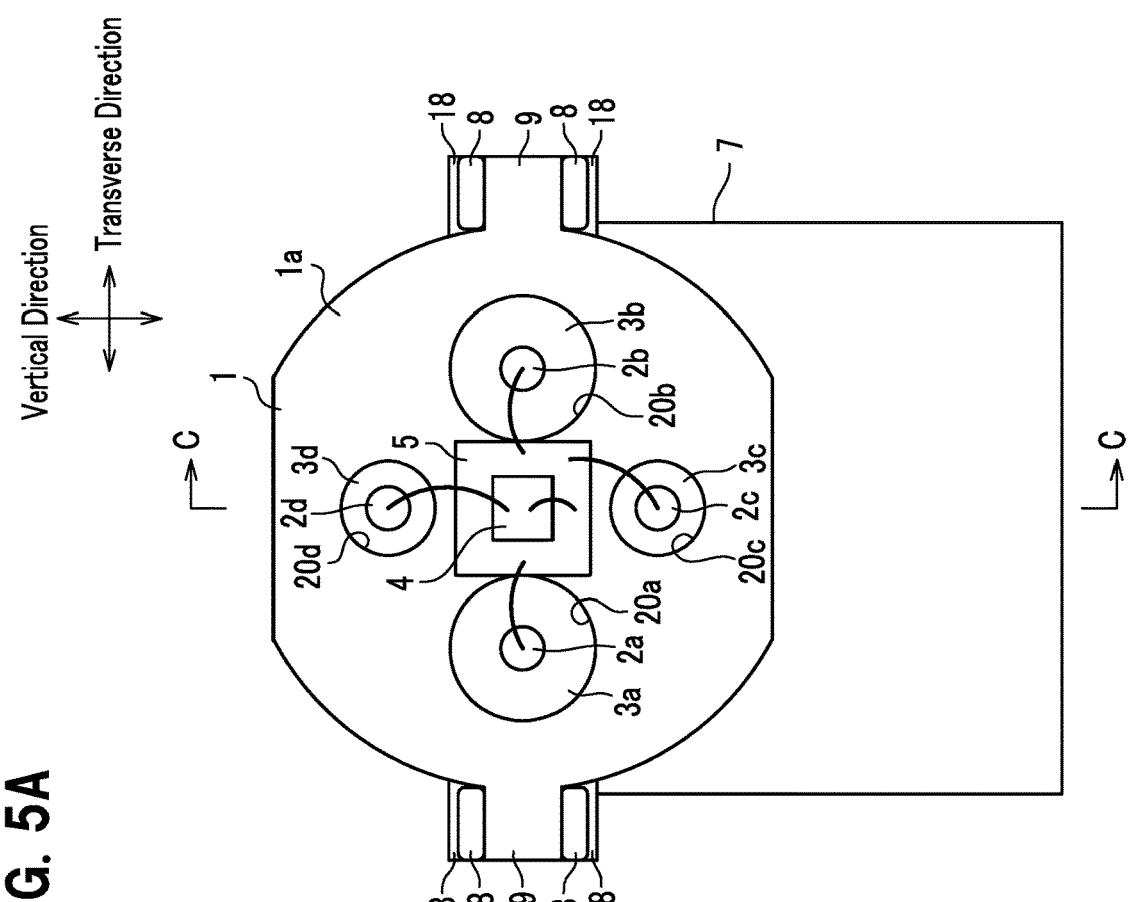
FIG. 5A is a front view of an optical module according to a third embodiment.
Figure 5B:
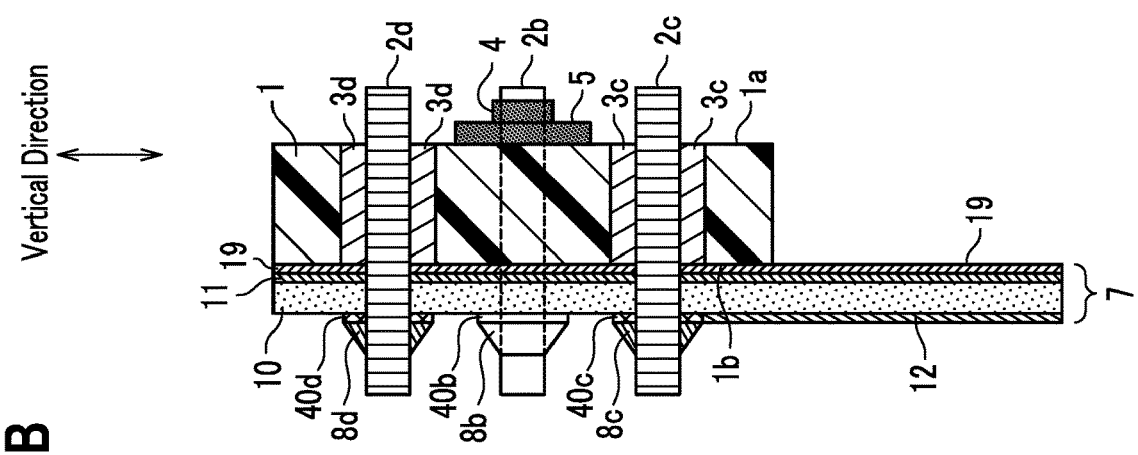
FIG. 5B is a cross-sectional view of the optical module taken along the C-C line of FIG. 5A.

An optical module 100C illustrated in FIGS. 5A and 5B is an optical module using a TO-CAN package for optical reception of the present embodiment. What makes the optical module 100C of the present embodiment different from the optical module 100B of the second embodiment is mainly that a flat portion is provided at the outer periphery of the stem 1. In addition, the optical module 100C is also different from the optical modules 100A, 100B in that: the optical module 100C includes two ground connection lands 18 disposed with the center of the stem 1 interposed therebetween, and two protrusions 9 disposed with the center of the stem 1 interposed therebetween; and the ground connection lands 18 are provided with solders 8, respectively. Incidentally, the number of ground connection lands 18 and the number of protrusions 9 in the optical module 100C, as well as the positions of the respective ground connection lands 18 and the positions of the respective protrusions 9 in the circumferential direction of the stem 1 are applicable not only to the present embodiment but also to other embodiments. Furthermore, as illustrated in FIG. 5A, a transverse width of the FPC 7, except for where the ground connection lands 18 exist, can be set equal to a transverse width of the stem 1. Such a shape is not limited to the present embodiment, and can also be applied to other embodiments.

The third and fourth lead pins 2c, 2d for the biases are disposed in the vertical direction such that a space between them is large enough for the amplifier 5 to be mounted between them, as described in the second embodiment. Thus, considerably large unoccupied spaces are respectively formed in the two vertical ends of the stem 1. In a case where no other elements or lead pins are disposed in the unoccupied spaces, the forming of the flat parts in the respective two vertical ends of the stem 1 makes it possible to further reduce the size of the stem 1. In other words, the stem 1 is formed in such shape that two portions are cut away from the stem 1 in parallel to a straight line connecting the first and second lead pins 2a, 2b for the signals which are disposed in the transverse direction with the amplifier 5 interposed between them, as well as the ground connection lands 18, 18 and the protrusions 9, 9 are disposed substantially on this straight line. The arrangement like this makes it possible to much further reduce the size of the optical module.

Characteristic impedances of the first and second lead pins 2a, 2b serving as the signal pins are preferably set to an impedance (for example, 50Ω) matching an output impedance of the amplifier 5. Meanwhile, impedances of the third and fourth lead pins 2c, 2d for the biases are preferably set low, since the third and fourth lead pins 2c, 2d are connected to an external power supply or the like. Therefore, the glasses 3c, 3d which insulate the third and fourth lead pins 2c, 2d for the biases can have a smaller dimension in the radial direction than the glasses 3a, 3b which insulate the first lead pin 2a and the second lead pin 2b for the signals.

With the above situation taken into consideration, as illustrated in FIG. 5A, the first and second lead pins 2a, 2b for the signals are disposed in the transverse direction with the amplifier 5 interposed therebetween, while the third and fourth lead pins 2c, 2d for the biases are disposed in the vertical direction with the amplifier 5 interposed therebetween. This arrangement makes it possible to provide the vertical ends of the stem 1 with respective large unoccupied spaces, and to enlarge the notched areas at the two vertical ends of the stem 1. In other words, since the stem 1 is formed in such shape that the portions are cut away from the stem 1 in parallel to the straight line connecting the first and second lead pins 2a, 2b for the signals, the vertical dimension of the stem 1 can be reduced to a large extent. In addition, since the FPC 7 is formed in such shape that as illustrated in FIG. 5A, an upper portion is cut away from the FPC 7 corresponding to the shape of the stem 1, the height of the optical module 100C can be reduced to a large extent.

Figure 6:
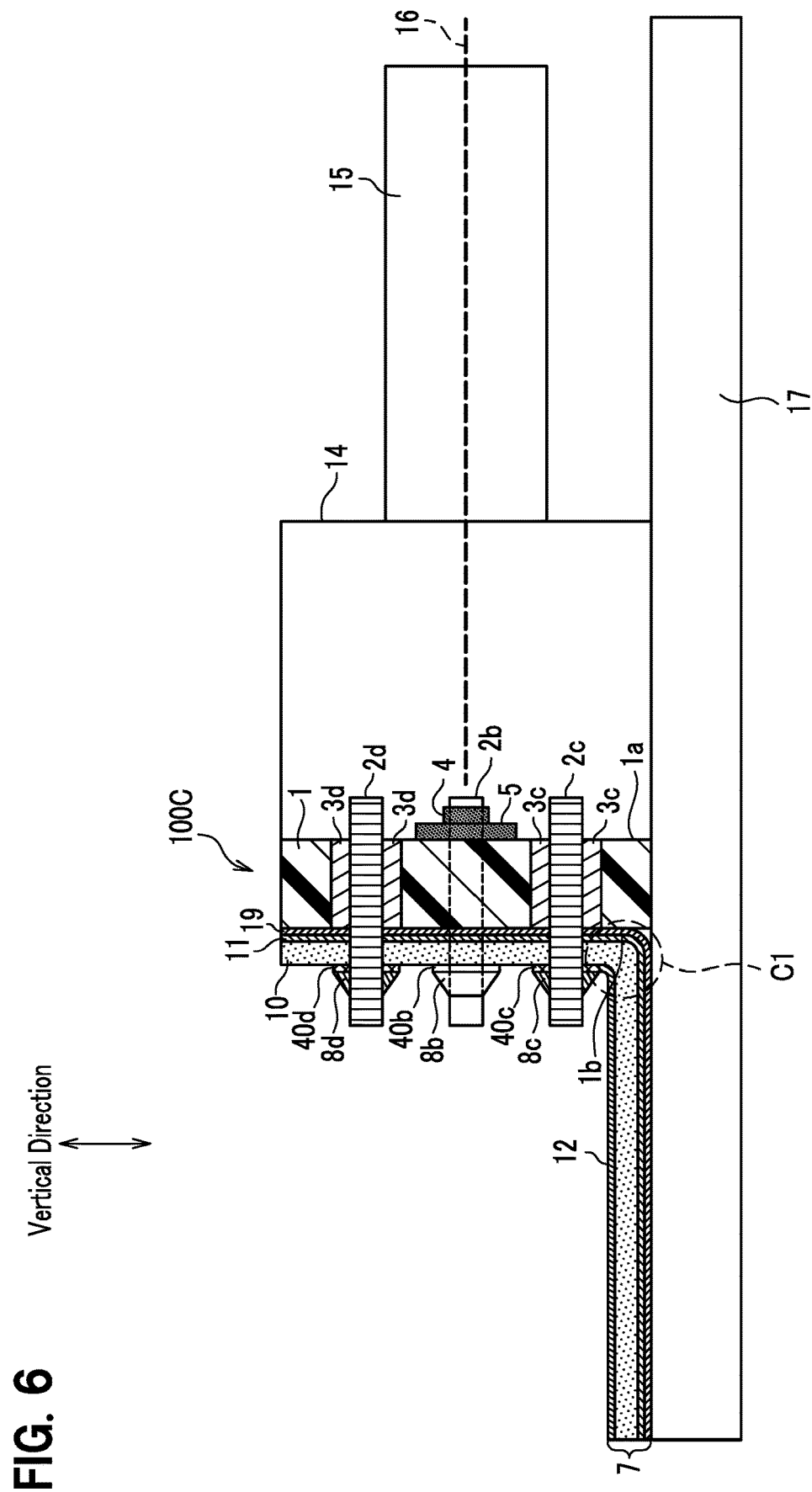
FIG. 6 is a cross-sectional view of the optical module according to the third embodiment as mounted on the mother board.

Furthermore, the larger the notched regions at the two vertical ends of the stem 1, the closer the bent position when the FPC 7 is bent is to the center of the stem 1. Thus, as shown in FIG. 6, the position near the outer side in the radial direction of the third lead pin 2c can be set as the bending position of the FPC 7 (see reference sign C1 in FIG. 6). The bending position indicated with reference sign C1 is closer to the center of the stem 1 than the bending position (see reference sign B1 in FIG. 4) shown in the second embodiment. This makes it possible to further reduce the overall height of the optical module 100C, specifically to reduce the height of the optical module 100C to two thirds of that of the conventional example (the comparative example) illustrated in FIG. 12.

Moreover, since the optical module 100C includes the two ground connection lands 18, the area in which to ground-connect the stem 1 and the FPC 7 can be increased, and the heat dissipation performance of the stem 1 can be enhanced further. This makes it easy to deal with the increase in the heat dissipation density accompanied by the size reduction, and accordingly makes it possible to enhance the reliability of the smaller-sized optical module. Incidentally, the ground connection lands 18 (and a portion of the FPC supporting the ground connection lands 18 which is located outside the circular stem main body) may be formed in any shape, as long as the shape enables the ground connection lands 18 to be soldered to the protrusions 9 of the stem 1. The ground connection lands 18 may be formed in various shapes including not only a rectangular (quadrangular) one, but also a triangular (triangular prismatic) one which is the shape of the protrusion 9 exemplified in FIG. 2.

Fourth Embodiment

Figure 7A:
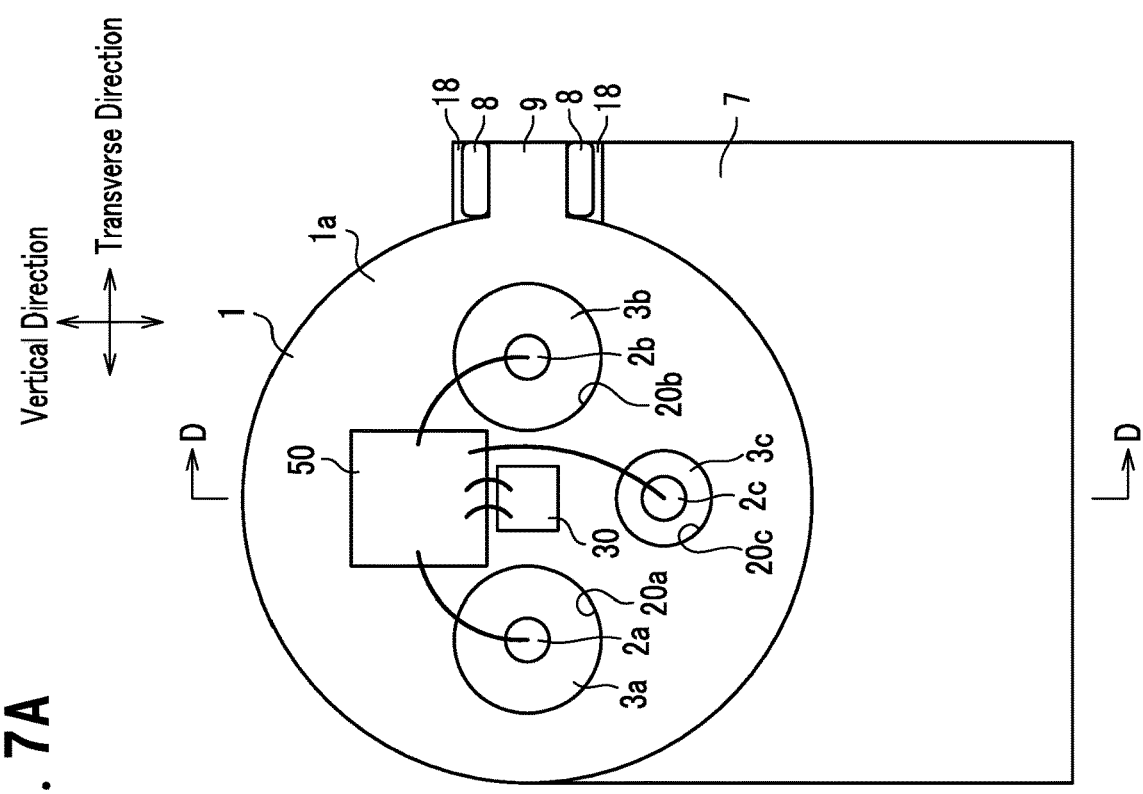
FIG. 7A is a front view of an optical module according to a fourth embodiment.
Figure 7B:
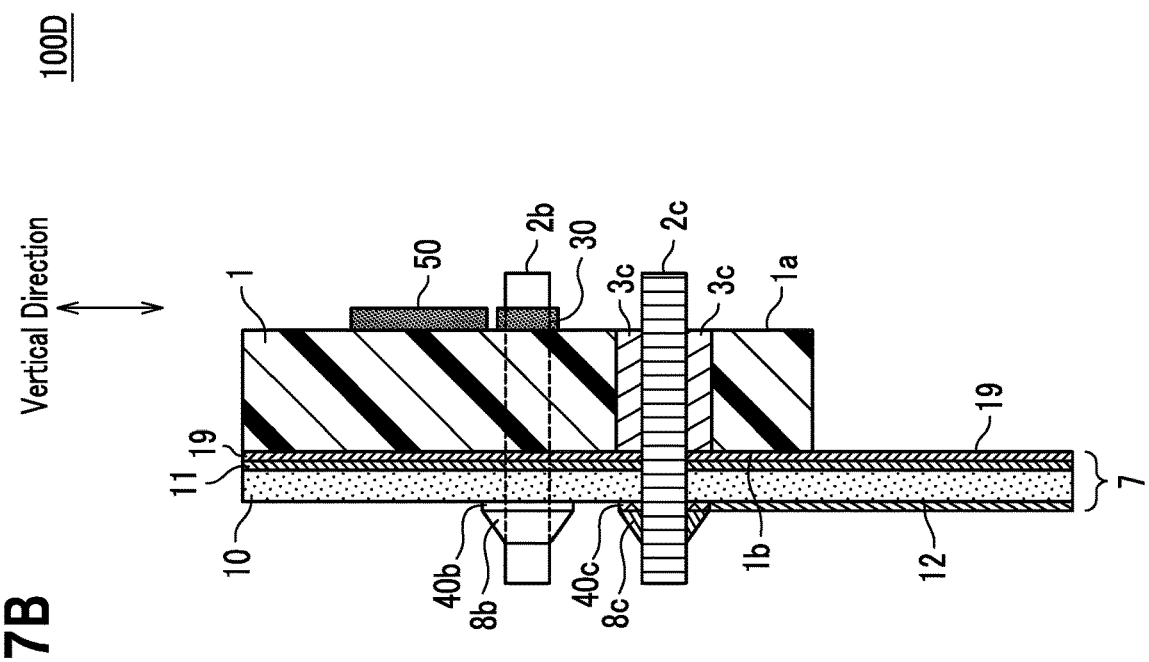
FIG. 7B is a cross-sectional view of the optical module taken along the D-D line of FIG. 7A.

An optical module 100D illustrated in FIGS. 7A and 7B is an optical module using a TO-CAN package for optical transmission according to the present embodiment. There are mainly three differences between the optical module 100D of the present embodiment and the optical module of the first embodiment. First, the optical module 100D includes a VCSEL (Vertical Cavity Surface Emitting LASER) 30 (a laser diode: an element: an optical element) which is a laser diode, instead of the photodiode 4. Second, the optical module 100D has a driver 50 (a driving circuit: an element: an electrical element) instead of the amplifier 5. Third, the optical module 100D has three lead pins in total: a single lead pin 2c for a bias instead of the two lead pins for the biases, a lead pin 2a for signal input, and a lead pin 2b for inverted signal input.

The VCSEL 30 resonates light in a direction perpendicular to the main surface of the stem 1, and emits an optical signal in the perpendicular direction.

The driver 50 outputs a drive signal in order to make the VCSEL 30 emit the optical signal.

In order for differential signals to be inputted into the optical module 100D from the outside, a signal input terminal of the driver 50 is wire-connected to the lead pin 2a, and an inverted signal input terminal of the driver 50 is wire-connected to the lead pin 2b. In addition, the output terminals of the driver 50 are wire-connected to the terminals (anode/cathode) of the VCSEL 30. Thus, the drive signal is transmitted, and the optical signal is emitted. Furthermore, by attaching a cap (not shown) having a light-emitting window or lens to the optical module 100D, the optical signal transmission is realized.

The effects of the optical module 100A functioning as the optical reception system shown in the first embodiment is also applied to the optical module 100D functioning as the optical transmission system shown in the present embodiment. In other words, although the optical module functions as the optical transmission system, the overall size of the optical module can be reduced.

Fifth Embodiment

Figure 8A:
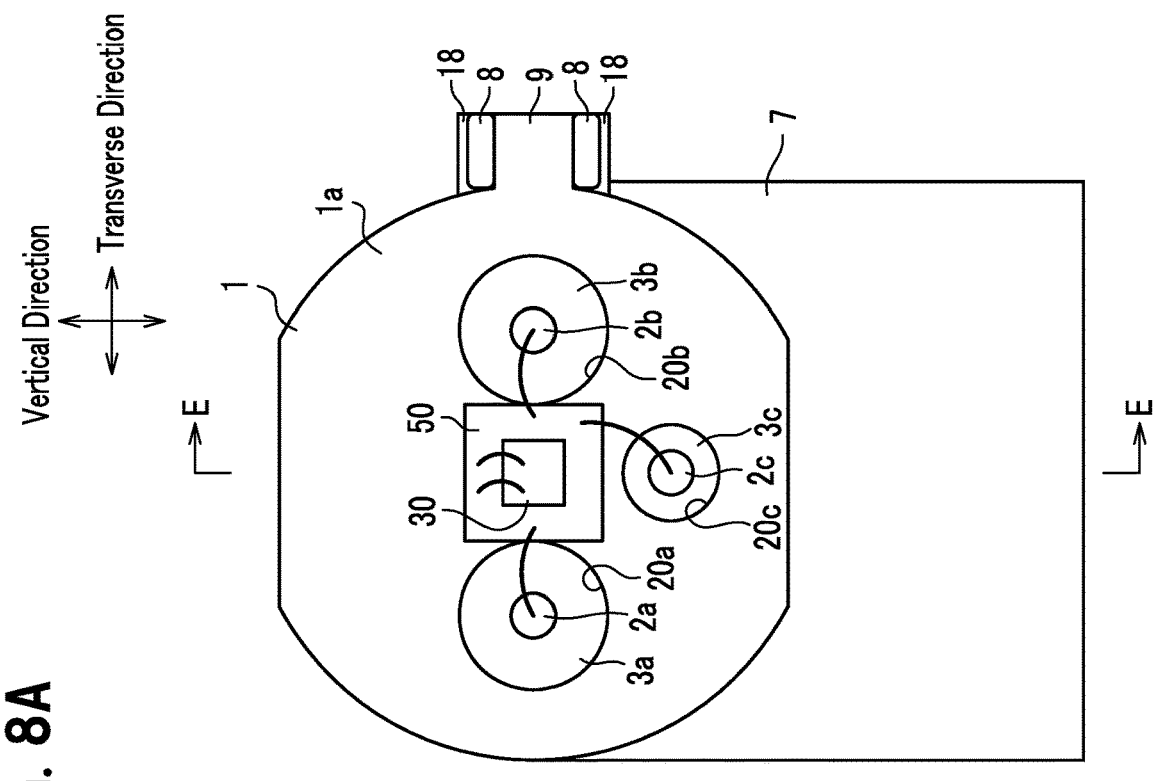
FIG. 8A is a front view of an optical module according to a fifth embodiment.
Figure 8B:
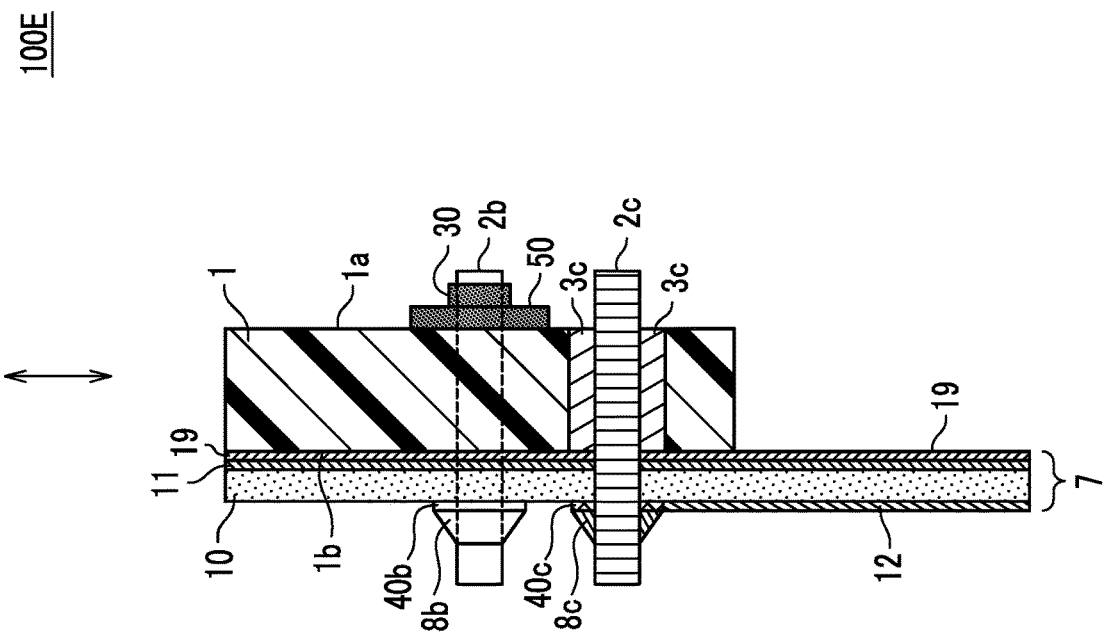
FIG. 8B is a cross-sectional view of the optical module taken along the E-E line of FIG. 8A.

An optical module 100E illustrated in FIGS. 8A and 8B is an optical module using a TO-CAN package for optical transmission according to a fifth embodiment. There are three differences between the optical module 100E of the present embodiment and the optical module 100D of the fourth embodiment. First, the VCSEL 30 is disposed on the driver 50. Second, the lead pins 2a to 2c are positioned so as to surround the driver 50. Third, a flat part is provided at an outer periphery of the stem 1. As illustrated in FIG. 8A, the VCSEL 30 and the driver 50 are disposed at the center of the front main surface 1a of the stem 1.

The first and second lead pins 2a, 2b for the signals are disposed in the transverse direction such that a space between them is large enough for the driver 50 to be mounted between them. In addition, the single third lead pin 2c for the bias is disposed under the driver 50 on the sheet of FIG. 8A. In other words, the lead pins 2a to 2c are disposed close to the driver. The arrangement of the lead pins 2a to 2c in this manner makes it possible to minimize the diameter of the stem 1.

As illustrated in FIG. 8A, the first and second lead pins 2a, 2b for the signals are disposed in the transverse direction with the driver 50 interposed therebetween. Furthermore, the third lead pin 2c for the bias is disposed under the driver 50 on the sheet of FIG. 8A. Specifically, the stem 1 is formed in such shape that portions are cut away from the stem 1 in parallel to a straight line connecting the first and second lead pins 2a, 2b for the signals. Thus, the vertical dimension of the stem 1 can be reduced to a large extent. In addition, since the FPC 7 is formed in such shape that as illustrated in FIG.

8A, an upper portion is cut away from the FPC 7 corresponding to the shape of the stem 1, a height of the optical module 100E can be reduced to a large extent.

The optical module 100E of the fifth embodiment is substantially the same as the optical module 100D of the fourth embodiment for explaining an optical transmission system in which the characteristics of the optical modules of the first to third embodiments for explaining an optical reception system are introduced. Therefore, the optical module 100E as an optical transmission system achieves the same effects as the first to third embodiments, and the optical module 100E can be reduced in size, particularly in height in the vertical direction.

Sixth Embodiment

Figure 9A:
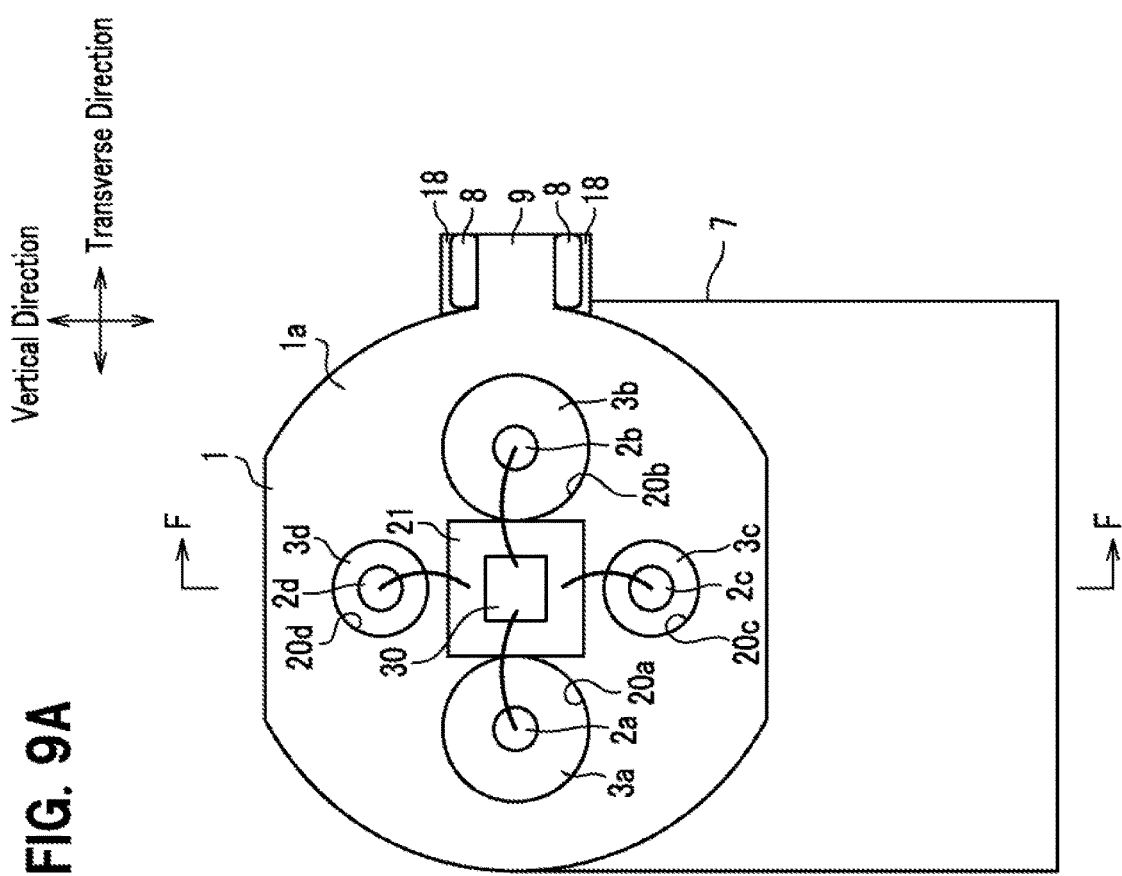
FIG. 9A is a front view of an optical module according to a sixth embodiment.
Figure 9B:
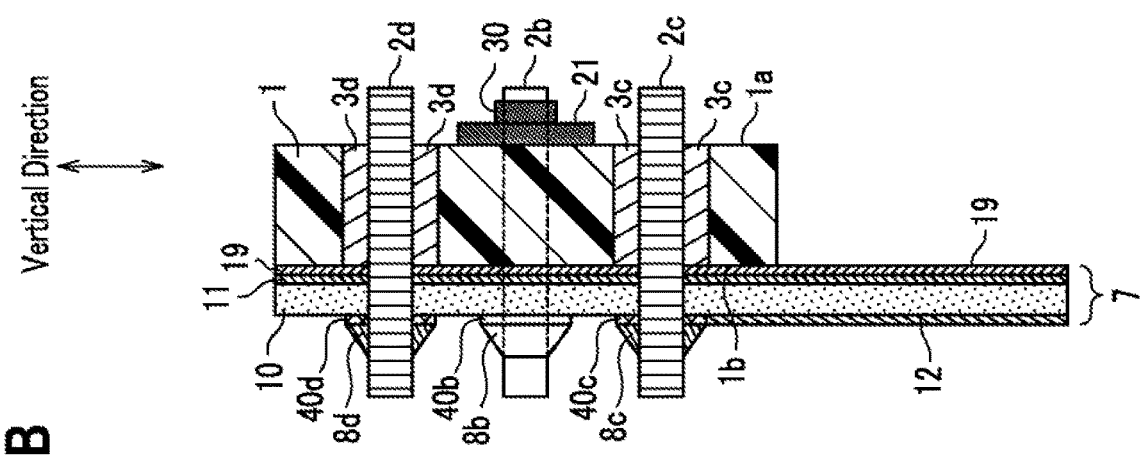
FIG. 9B is a cross-sectional view of the optical module taken along the F-F line of FIG. 9A.

An optical module 100F illustrated in FIGS. 9A and 9B is an optical module using a TO-CAN package for optical transmission of the present embodiment. What makes the optical module 100F of the sixth embodiment different from the optical module 100E of the fifth embodiment is mainly that the optical module 100F includes a monitoring photodiode 21 (an element: an optical element) instead of the driver 50. As illustrated in FIG. 9A, the VCSEL 30 and the monitoring photodiode 21 are disposed at the center of the front main surface 1a of the stem 1. Furthermore, the VCSEL 30 is disposed on the monitoring photodiode 21. Incidentally, the driver is mounted on the mother board to which the FPC 7 is connected (not shown).

The monitoring photodiode 21 receives a light reflection signal from the cap (not shown) attached to the optical module 100F, and generates an electric current corresponding to an optical transmission power from the VCSEL 30. The electric current is sent to the mother board via the FPC 7, and is used by the VCSEL 30 for performing APC (automatic power control) and the like. Thus, an optical transmission signal can be stabilized.

The optical module 100F of the sixth embodiment forms an optical transmission system which is different from that of the optical module 100E of the fifth embodiment. The optical module 100F includes four lead pins 2a to 2d in total, two of which are the third and fourth lead pins 2c, 2d for the biases. The first and second lead pins 2a, 2b are respectively used to input a signal and an inverted signal into the VCSEL 30, and are wire-connected to the anode and cathode of the VCSEL 30, respectively. Furthermore, the third and fourth lead pins 2c, 2d are wire-connected to the anode and cathode of the monitoring photodiode 21, respectively. Once a drive signal is transmitted to the VCSEL 30 from the outside, the VCSEL 30 emits an optical signal in the perpendicular direction. Moreover, the third and fourth lead pins 2c, 2d for the biases are disposed in the vertical direction such as a space between them is large enough for the monitoring photodiode 21 to be mounted between them.

Although the optical module 100F of the sixth embodiment constitutes an optical transmission system different from that of the optical module 100E of the fifth embodiment, the effects of the fifth embodiment can be realized. In other words, the optical module 100F of the sixth embodiment serving as the optical transmission system can exert all the same effects as the optical modules of the first to third embodiments, and can achieve a reduction in the size of the optical module 110E, particularly a reduction in its height in the vertical direction.

Seventh Embodiment

Figure 13:
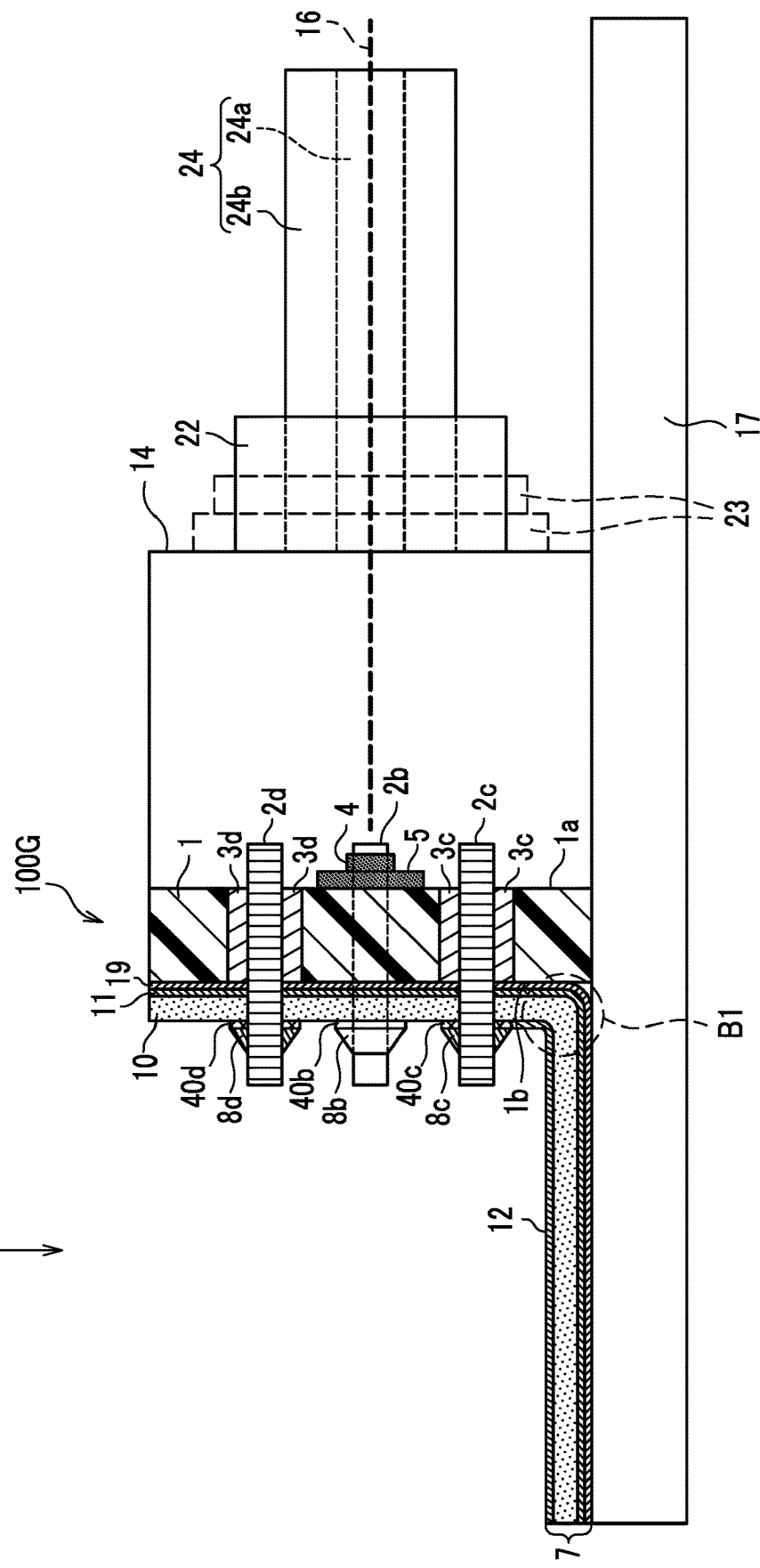
FIG. 13 is a cross-sectional view of an optical module according to a seventh embodiment as mounted on the mother board.

An optical module 100G illustrated in FIG. 13 is an optical module using a TO-CAN package for optical reception of the present embodiment. There are three differences between the optical module 100G of the present embodiment and the optical module 100B of the second embodiment. First, a cap 14 including a light-incident window or lens is attached to the stem 1. Second, a part called an optical fiber stub 24 is used as an optical connection part 15 (see FIG. 4). Third, the optical fiber stub 24 is aligned with and fixed to the cap 14. The optical fiber stub 24 is a part comprising an optical fiber strand 24a and a cylindrical ceramic 24b. It is preferable that the optical fiber stub 24 is formed as a part obtained by: making a hole, having substantially the same diameter as the optical fiber strand 24a, at the center of the cylindrical ceramic 24b excellent in mechanical strength; making the optical fiber strand 24a penetrate through the hole; and thereafter optically polishing the two ends of the optical fiber strand 24a.

In the present embodiment, YAG (Yttrium Aluminum Garnet) laser welding is used to align and fix the optical fiber stub 24. To this end, a part obtained by integrally fixing a cylindrical metal-made flange 22 (an aligning-fixing part) to the optical fiber stub 24 in advance is held by an X-Y two-axis stage (not shown). The metal-made flange 22 is a member for aligning the optical fiber stub 24 with the cap 14 and fixing the optical fiber stub 24 to the cap 14. The X-Y two-axis stage is a jig for aligning the optical fiber stub 24 with the cap 14 and fixing the optical fiber stub 24 to the cap 14 by the metal made flange 22 with respect to the vertical direction (X) and the transverse direction (Y). Using the X-Y two-axis stage, peak alignment is performed on the light emitted from the cap 14 on a horizontal plane (an X-Y plane). When a peak position is obtained, the metal-made flange 22 is fixed to the cap 14 by YAG laser welding. Incidentally, the fixing of the metal-made flange 22 to the optical fiber stub 24 may be performed, for example, by using an epoxy-based adhesive, or by swaging the metal-made flange 22. The X-Y two-axis alignment of the optical fiber stub 24 is realized by the above steps.

In order to achieve more efficient optical coupling, as shown in FIG. 13, by additionally disposing a cylindrical metal part called a Z-sleeve 23 (an aligning-fixing part) on the outer periphery of the metal-made flange 22, an X-Y-Z three-axis alignment is also possible. "Z" represents a direction which is perpendicular to the X-Y plane, and which is identical to the direction of the optical axis 16. The Z-sleeve 23 is a member for, while fixed to the metal-made flange 22, aligning the optical fiber stub 24 with the cap 14 and fixing the optical fiber stub 24 to the cap 14. The fixing of the Z-sleeve 23 to the metal-made flange 22 may be performed, for example, by using an epoxy-based adhesive, or by swaging the Z-sleeve 23.

The X-Y-Z three-axis alignment can be achieved with the optical fiber stub 24 held by an X-Y-Z three-axis stage (not shown). The X-Y-Z three-axis stage is a jig for aligning the optical fiber stub 24 with the cap 14 and fixing the optical fiber stub 24 to the cap 14 with regard to the vertical direction (X), the transverse direction (Y) and the perpendicular direction (Z) with the metal-made flange 22 and Z-sleeve 23. Using the X-Y-Z three-axis stage, peak alignment is performed on the light emitted from the cap 14. Once a peak position is obtained, the metal-made flange 22 is fixed to the cap 14 by YAG laser welding.

Otherwise, the X-Y-Z three-axis alignment can be achieved, too, by coordinately operating the X-Y stage with the optical fiber stub 24 held thereby, and a Z stage (not shown) with the stem 1 held thereby while the cap 14 is fixed to the stem 1. Either of the two alignment methods can be used. The Z stage is a jig for aligning the optical fiber stub 24 with the cap 14 and fixing the optical fiber stub 24 to the cap 14 with respect to the direction (Z) of the optical axis 16.

Thus, the photodiode 4 through which the optical axis 16 of the optical fiber stub 24 passes receives the optical signal inputted from the optical fiber stub 24 with a very high optical coupling rate.

The FPC 7 includes a pad (not shown) for connecting the FPC 7 to the mother board 17. The FPC 7 can therefore send and receive an electrical signal to and from the mother board 17. Since the optical IF (Interface) of the optical module 100G of the present embodiment becomes the optical fiber stub 24, it is necessary to provide a receptacle to an apparatus or the like on the other side. This means the configuration of the optical module 100G of the seventh embodiment is to the reverse of the configuration of the optical module disclosed in Patent Literature 1. However, according to the configuration of the optical module 100G of the present embodiment, since the optical module 100G itself does not have a receptacle, the optical module 100G can be miniaturized and reduced in height. As a result, the optical module 100G of the present embodiment can be miniaturized to a size smaller than that of the receptacle.

Although the mating device or the like, which the optical module 100G is optically connected to, is required to include a receptacle, the mating device has a higher degree of freedom in the design since the mating device is formed from only passive parts. Overall, reductions in the size and height can be easily achieved. The effect of reducing the size is more obvious in an array configuration and the like using multiple optical modules 100G.

<<Modifications>>

The present invention is not limited to the foregoing embodiments.

Modifications can be made to the present invention within a scope not departing from the gist or spirit of the present invention. Examples of modifications include the followings (a) to (i).

(a) According to the present embodiment, the case where the stem 1 is provided with the projection 9 has been described, but it is also possible to adopt a stem in which the projection 9 is not provided, and to solder (ground connection) the ground connection land 18 of the FPC 7 and the side surface of the main body part of the stem.

(b) The laser diode used in the present embodiments is not limited to the VCSEL 30, and may be a DFB (Distributed FeedBack) laser diode or other laser diode. Otherwise, a light-emitting diode may be used.

(c) According to the present embodiment, the case where the FPC 7 is applied as a substrate has been described, but the present invention can be applied not only to the FPC 7 but also to a rigid substrate.

(d) The stem 1 is not limited to the disc-shaped body. The stem 1 may be a rectangular body, an elliptical body or the like. Alternatively, the stem 1 may be formed with an arc part. Otherwise, the arc part may be formed in such shape that portions of the arc part are cut away in parallel to the straight line connecting the first and second lead pins 2a, 2b.

(e) Means for electrically connecting the ground connection land 18 and the protrusion 9 of the stem 1 is not limited to solder, and may be a conductive resin or the like.

(f) According to the fifth embodiment, the third lead pin 2c is disposed close to and under the driver 50 on the sheet of FIG. 8A. Thus, the considerably large unoccupied space is formed over the driver 50. The vertical dimension of the stem 1 can be therefore reduced to a large extent by forming the stem 1 in such shape that most of the unoccupied space is cut away.

(g) According to the fifth embodiment, the third lead pin 2c is disposed below the driver 50. Instead, however, the third lead pin 2c may be disposed above the driver 50. Thus, a considerably large unoccupied space is formed below the driver 50. The vertical dimension of the stem 1 can be therefore reduced to a large extent by forming the stem 1 in such shape that most of the unoccupied space is cut away. In addition, when the FPC 7 with which the stem 1 is put in close contact is mounted onto the mother board 17 by being bent, the bending position where to bend the FPC 7 can be made closer to the center of the stem 1. Thus, the overall size of the optical module 100E can be reduced. Specifically, the vertical height of the optical module 100E can be reduced.

(h) Although the seventh embodiment in which the integral part formed from the optical fiber strand 24a and the cylindrical ceramic 24b is used as the optical fiber stub 24 has been discussed, the shape of the cylindrical ceramic 24b is not limited to the cylindrical one, and may be an angled one or other one. Furthermore, the material of the cylindrical ceramic 24b is not limited to ceramic, and may be metal or plastic. Moreover, the reducing of the size of the optical module 100G discussed in the seventh embodiment can be performed independently of the reducing of the sizes of the optical modules by designing the stems 1 with the small diameter which have been discussed in the first to sixth embodiments. The size reduction achieved in the seventh embodiment, therefore, can be combined with the size reductions achieved in the first to sixth embodiments.

(i) According to the present embodiments, the ground connection land 18 is disposed such that the direction of the straight line segment between the center of the stem 1 and the center of the ground connection land 18 is orthogonal to the direction in which the FPC 7 is drawn out from the stem 1. The position of the ground connection land 18, however, is not limited to this. The ground connection land 18 may be disposed, for example, at an arbitrary position within a range not exceeding the two vertical ends of the stem 1. Even this arrangement makes it possible to mount the FPC 7 onto the mother board 17 with a reduced height since the ground connection land 18 does not project from the main body part of the stem 1 toward the mother board 17.

According to the above embodiments, the stem 1 and the ground connection land 18 are connected to each other by the protrusion 9, but as in the modification (a), the stem 1 and the ground connection land 18 may be directly connected to each other.

The ground connection land 18 may be provided near the connection part, and is not limited to the outer edge or the outer side of the stem 1.

Furthermore, techniques obtained by combining the various techniques discussed in the embodiments can be realized.

In addition, the shapes, materials and functions of the components of the present invention can be appropriately changed within the scope not departing from the gist or spirit of the present invention.

REFERENCE SIGNS LIST 100A to 100G optical module
1 stem
1a front main surface (first main surface)
1b rear main surface (second main surface)
2a, 2b lead pin (signal pin)
2c, 2d lead pin (bias pin)
2e lead pin (ground pin for grounding)
3a to 3d glass (insulated material)

4 photodiode (element: optical element)
5 amplifier (element: electrical element)
7 FPC (circuit board: flexible printed circuit board)
8, 8a to 8d solder
9 protrusion
10 dielectric
11 lower layer ground
12 upper layer wire
14 cap
15 optical waveguide means (optical connection part)
16 optical axis
17 mother board
18 ground connection land
19 protective layer
20a to 20d through-hole
21 monitoring photodiode (element: optical element)
22 (YAG welding) metal-made flange (aligning-fixing part)
23 Z-sleeve (aligning-fixing part)
24 optical fiber stub
24a optical fiber strand
24b cylindrical ceramic
30 VCSEL (laser diode: element: optical element)
40a to 40e land
50 driver (driving circuit: element: electrical element)

The invention claimed is:

1. An optical module comprising:
a stem, wherein the stem includes a protrusion on a side surface of the stem;
a lead pin extending through the stem;
an insulated material filled between the stem and the lead pin;
an optical element and an electrical element which are disposed on a first main surface of the stem and which are connected to the lead pin at a terminating end of the lead pin, the optical element having a vertical end;
a circuit board in contact with a second main surface of the stem;
a cap attachable to the stem, wherein the terminating end of the lead pin is within the cap;
an optical fiber stub; and
an aligning-fixing part which aligns the optical fiber stub with the cap and fixes the optical fiber stub to the cap;
wherein the vertical end of the optical element and the electrical element are disposed on the first main surface of the stem.

2. The optical module according to claim 1:
wherein the circuit board includes a ground connection land directly connected to the stem.

3. The optical module according to claim 2:
wherein
the optical element is disposed on the electrical element.

4. The optical module according to claim 2:
wherein the circuit board is a flexible printed circuit board; and
a straight line segment between a center of the stem and a center of the ground connection land is substantially orthogonal to a direction in which the flexible printed circuit board is drawn out from the stem.

5. The optical module according to claim 2:
wherein the lead pin includes two signal pins; and
the two signal pins are disposed substantially on a straight line connecting the center of the stem and the center of the ground connection land, and symmetrically with respect to the center of the stem.

6. The optical module according to claim 5:
wherein the stem is formed with an arc part; and
the arc part is formed in such shape that a portion of the arc part is cut away in substantially parallel to a straight line connecting the two signal pins.

7. The optical module according to claim 2:
wherein the [stem includes a] protrusion is opposite to the ground connection land.

8. The optical module according to claim 7:
wherein the optical module includes two or more of ground connection lands, and two or more of protrusions corresponding to the ground connection lands.

9. The optical module according to claim 2:
wherein the optical element includes a photodiode, and the electrical element includes an amplifier.

10. The optical module according to claim 2:
wherein the optical element includes a laser diode or a light-emitting diode, and the electrical element includes a driver.

11. The optical module according to claim 2:
wherein the optical module includes two or more of ground connection lands.

12. The optical module according to claim 2:
wherein elements are disposed proximate to each other.

13. The optical module according to claim 2:
wherein the ground connection land outside the stem is directly connected to the stem.

14. An optical module comprising:
a stem;
a lead pin extending through the stem;
an insulated material filled between the stem and the lead pin;
an optical element and an electrical element which are disposed on a first main surface of the stem and which are connected to the lead pin, the optical element having a vertical end; and
a circuit board in contact with a second main surface of the stem;
wherein the vertical end of the vertical element and the electrical element are disposed on the first main surface of the stem;
the circuit board includes a ground connection land directly connected to the stem;
the stem includes a protrusion on a side surface of the stem, the protrusion being opposite to the ground connection land; and
the protrusion is electrically connected to the ground connection land.

15. The optical module according to claim 3:
wherein the circuit board is a flexible printed circuit board; and
a straight line segment between a center of the stem and a center of the ground connection land is substantially orthogonal to a direction in which the flexible printed circuit board is drawn out from the stem.

16. The optical module according to claim 3:
wherein the lead pin includes two signal pins; and
the two signal pins are disposed substantially on a straight line connecting the center of the stem and the center of the ground connection land, and symmetrically with respect to the center of the stem.

17. The optical module according to claim 3:
wherein the stem includes a protrusion opposite to the ground connection land.

18. The optical module according to claim 4:
wherein the stem includes a protrusion opposite to the ground connection land.

19. The optical module according to claim 5:
wherein the stem includes a protrusion opposite to the ground connection land.

20. The optical module according to claim 6:
wherein the stem includes a protrusion opposite to the ground connection land.

\* \* \* \* \*